(12) United States Patent
Albinsson

(10) Patent No.: US 6,501,181 B2
(45) Date of Patent: Dec. 31, 2002

(54) ARRANGEMENT RELATING TO ELECTRONIC CIRCUITRY

(75) Inventor: Björn Albinsson, Göteborg (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 172 days.

(21) Appl. No.: 09/732,027

(22) Filed: Dec. 8, 2000

(65) Prior Publication Data

US 2001/0003380 A1 Jun. 14, 2001

(30) Foreign Application Priority Data

Dec. 10, 1999 (SE) ............................................. 9904527

(51) Int. Cl.[7] .............................................. H01L 23/48
(52) U.S. Cl. ...................... 257/774; 257/775; 257/728
(58) Field of Search ................... 257/777, 774, 257/775, 728

(56) References Cited

U.S. PATENT DOCUMENTS

| 4,401,955 A | 8/1983 | Yorinks et al. |
| 4,494,083 A | 1/1985 | Josefsson et al. |
| 4,816,791 A | 3/1989 | Carnahan et al. |
| 5,736,783 A | 4/1998 | Wein et al. |
| 5,844,450 A | 12/1998 | Buer et al. |

FOREIGN PATENT DOCUMENTS

| JP | 3226101 | 7/1991 |
| WO | WO98/44564 | 10/1998 |

*Primary Examiner*—Roy Potter

(57) ABSTRACT

The present invention relates to an arrangement in a multi-layered electronic circuit. In a transition between two planar transmission lines, a compensating element is used to keep the average capacitance per length unit more constant during the transition. A via conductor the passes near an edge of a planar conductor pattern, the via conductor and the planar conductor having a mutual capacitive coupling within a predetermined range. A compensating conductor is formed between the planar conductor and the via conductor, which conductor is connected to the planar conductor by a compensating via. If the segment of the via conductor which belongs to the same via hole pattern as the compensating via is displaced, the compensating via is also displaced. The compensating planar pattern is then disconnected from the planar conductor. This improves yield in a given multilayer process.

9 Claims, 5 Drawing Sheets

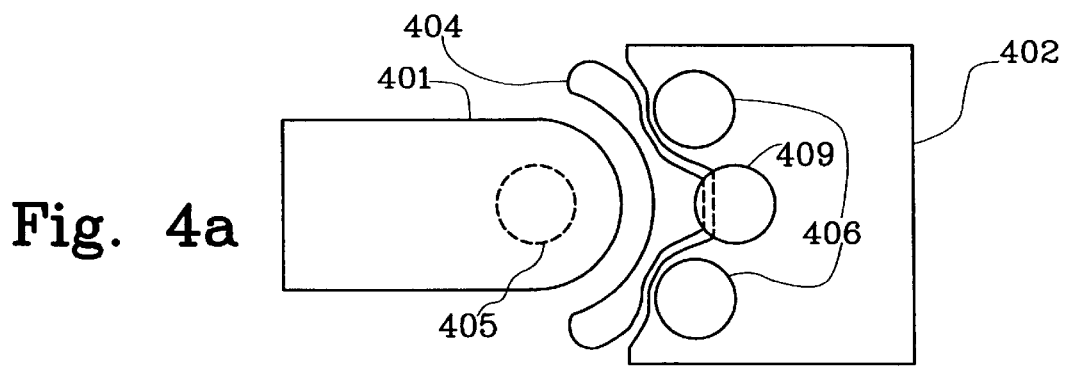
Fig. 4a
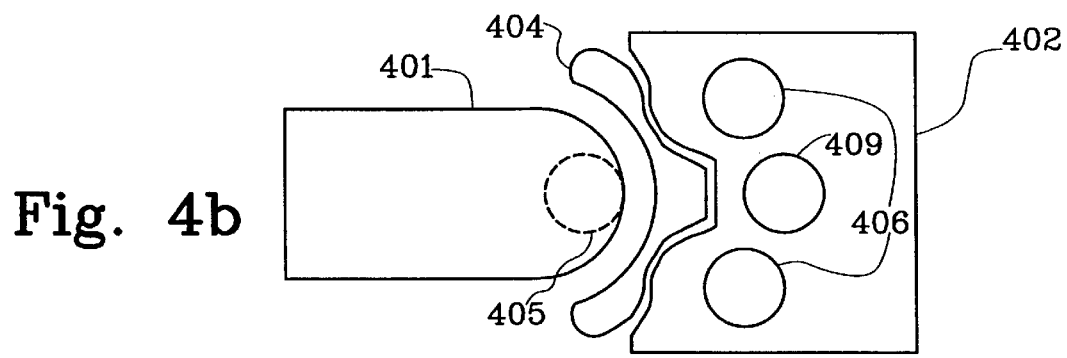
Fig. 4b
Fig. 5b
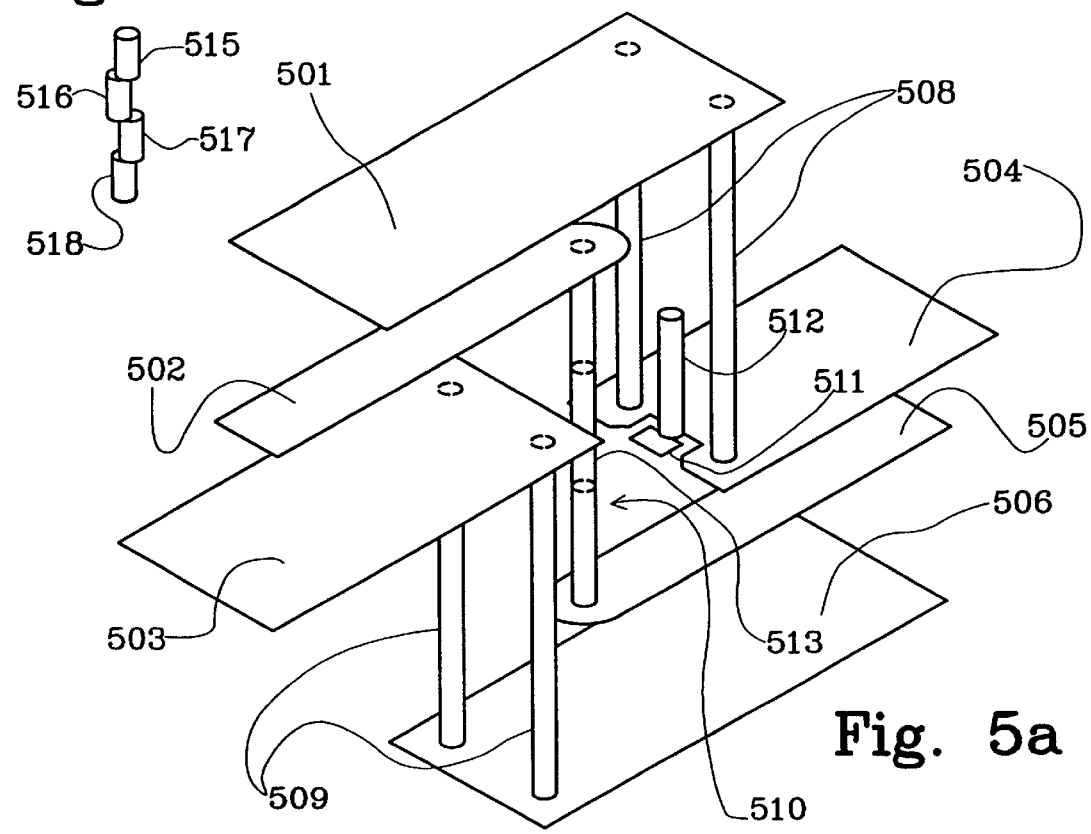
Fig. 5a

ARRANGEMENT RELATING TO ELECTRONIC CIRCUITRY

This application claims priority under 35 U.S.C. §§119 and/or 365 to 9904527-0 filed in Sweden on Dec. 10, 1999; the entire content of which is hereby incorporated by reference.

TECHNICAL FIELD OF THE INVENTION

The present invention relates to an arrangement in a multilayered electronic circuit for radio frequency applications, as well as a method of manufacturing such a circuit and a RF-circuit comprising such an arrangement.

DESCRIPTION OF RELATED ART

Multilayered RF-circuits are used more and more in communications technology and elsewhere. The reason for this is that they allow smaller circuits to be built. One process resulting in multilayered RF-circuits is the LTCC process, an abbreviation for Low Temperature Cofired Ceramics. This process generally involves steps as follows. First holes are punched in predetermined patterns in a number of substrates. The holes are filled with a conductive material. When the circuit is finished, this material forms vias, which provide for vertical transitions within the circuit. Then planar conductive patterns are printed on at least some of the substrates. The pattern may also include different passive and active components that are formed on the substrate. The planar conductive patterns provide horizontal transitions within the circuit. Then the substrates are stacked in a predetermined order and with a predetermined orientation. In a final step, they are fired at a relative low temperature (for instance 850° C.) to form a solid circuit.

An LTCC circuit normally contains a number of transmission lines. These may be devised as microstrip lines, striplines or even coaxial lines. A microstrip line, for instance, then consists of a planar ground conductor extending in a first plane and a planar signal conductor extending parallel to the ground conductor in a second plane adjacent to the first plane. The ground conductor normally has a wider lateral extension in its plane than the signal conductor has.

When two microstrip transmission lines, extending in different sets of layers are to be interconnected, this is arranged by means of via conductors. Then a first via interconnects the respective planar ground conductors, while another via interconnects the respective planar signal conductors.

A problem with this kind of transition is that the capacitance per length unit between the signal conductor and the ground conductor often is lower in the transition region as compared to the horizontally extending transmission line parts. This results in reflections when a signal having a predetermined frequency is propagated in the transmission line towards the transition region. The transition, thus, is not matched and this limits the RF performance, e.g. bandwidth, of the circuit.

A solution to this problem is to add a compensating element in the transition. This may be arranged in the following manner. If, for instance, the respective ground conductors of two interconnected planar transmission lines are placed above their respective signal conductors, the via interconnecting the signal conductors will pass in the vicinity of one edge of the lower planar ground conductor. If a projection is arranged in this planar conductor, protruding towards the via, this will result in a higher capacitance between the ground conductor and the signal via. Thus, the average capacitance per length unit between the signal conductor and the ground conductor is increased. This results in a circuit with improved RF performance.

It should be noted, however, in this context that the tolerances of the relative positions of adjacent layers as well as the relative positions of a via hole pattern and a planar conductor pattern within one layer in an LTCC circuit are relatively large.

This causes a problem with the above-described compensation arrangement. If a small change from the ideal distance between the ground conductor and parts of the signal via exists, the capacitance between them will differ from the intended one. The relation between distance and capacitance is a non-linear one. A relatively small displacement, positioning a segment part of the via conductor a bit closer to the planar ground conductor may render the compensating capacitance far too large. This is likely to reduce the bandwidth of the circuit to such an extent that it is useless for the intended purposes. A transition designed to be fully compensated in the ideal position will therefore have a relatively low yield when produced, i.e. only a relatively small number of circuits in a batch of a given size will function properly. This, of course, makes the circuits very expensive.

A procedure to deal with this problem is to undercompensate the transition, i.e. to design a ground conductor which, in an ideal relative position between the conductor and the via, has a capacitance somewhat less than the optimal capacitance. This results in higher yield but smaller bandwidth. Thus, a trade-off between yield and RF performance, e.g. bandwidth, exists

SUMMARY OF THE INVENTION

The present invention seeks to diminish the aforementioned problems.

One object of the present invention is to provide a low cost multilayered RF-circuit.

Another object is to achieve a multilayered RF-circuit with improved bandwidth.

Yet another object of the present invention is to achieve a method for producing a multilayered RF-circuit with improved yield.

The above-mentioned objects are achieved by means of an arrangement in a multilayered circuit, a method for manufacturing such a circuit in accordance with the invention as described below and multilayered RF-circuit comprising a similar compensating arrangement.

It has been observed by the inventor, that in a circuit manufactured in an LTCC process, the tolerances of the relative positions of different planar conductors within one layer are very small (typically around 5–10 μm) compared to the tolerances of the relative positions of adjacent layers (which are typically around 50–100 μm). The same applies for the relative positions of individual via holes within the via hole pattern in one layer, which also have small tolerances (typically around 5–10 μm). The manufacturing tolerances as regards position of the hole pattern vis-à-vis the position of the planar conductor pattern within one layer, however, is comparable to the tolerances of the relative positions of adjacent layers.

In accordance with the invention, the compensation in a transition between two planar transmission lines is made more process tolerant by utilising this observation. In an arrangement in accordance with the invention a first planar conductor, which may for instance constitute ground conductor in a planar transmission line, is formed on a first substrate layer among a plurality of substrate layers forming a multilayered circuit. The circuit further comprises a first via hole, formed in the first substrate layer or in a substrate layer adjacent to the first substrate layer on the side of the first planar conductor. The first via hole is filled with a conductive material and may form a segment part of a signal via providing a transition between two transmission lines. The capacitive coupling between the conductive material in the first via hole and the first planar conductor is intended to be within a predetermined range. In accordance with the invention a second planar conductor, which may be called a compensating planar conductor, is formed between the first via hole and the first planar conductor, on the same side of the same substrate layer as the first planar conductor. The surfaces of the first and the compensating planar conductors are formed to be non-intersecting. The first and the compensating planar conductors are interconnected by means of a conductive material disposed in a second via hole, which is formed in the same substrate layer as the first via hole. The second via hole may be called a compensating via hole.

Assume that the first planar conductor constitutes a ground conductor in a planar transmission line and that the conductive material with which the first via hole is filled forms a segment part of a signal via conductor, which intersects the plane in which the first planar conductor extends at a distance from its nearest edge. In an ideal case, in an arrangement in a circuit as defined above, a certain capacitance, within an intended range, is achieved between the first and second planar conductors on one hand and the intersecting via on the other. The equivalent model in this situation may schematically be described as a single capacitance C. If during the manufacturing of the circuit the hole pattern in question is displaced from its ideal position so that a part of the intersecting via approaches the first conductor, the compensating structure changes as well. This is due to the fact that the compensating via hole also is displaced. At a certain displacement of the hole pattern, the conductive material of the compensating via hole ceases to be in contact with both the first and the compensating conductor. This changes the schematic equivalent model of the compensating structure into two capacitances connected in series. The resulting capacitance of two capacitances connected in series may be written as $1/(1/C_1+1/C_2)$. This serves to compensate for the displacement of the segment of the intersecting via. The capacitance between the intersecting via and the planar ground conductor may therefore still be within the intended predetermined range.

This results in a less expensive circuit, since its fault tolerant qualities provide higher yield in a given manufacturing process.

It also allows multilayered RF-circuits with improved bandwidth properties to be produced at a relatively low cost.

A corresponding method may be defined where, in a step when via holes are formed in a layer, a via hole being positioned as said compensating via hole is formed. In another step in accordance with the invention, wherein a conductor pattern is disposed on a layer, a conductor corresponding to the compensating planar conductor as mentioned above is formed.

This results in a manufacturing process producing multilayered RF-circuits with improved yield.

An arrangement in a multilayered electronic circuit for radio frequency applications in accordance with the invention is then characterised as it appears from claims 1 or 10.

A method of manufacturing such a circuit in accordance with the invention is then characterised as it appears from claim 7. A multilayered RF-circuit comprising a compensating arrangement is further characterised in claim 10.

DESCRIPTION OF THE DRAWINGS

FIG. 4a and 4b illustrate a compensating arrangement in accordance with the invention for a transition between two transmission lines.

FIG. 5a illustrates schematically another compensating arrangement in accordance with the invention for a transition between two transmission lines. FIG. 5b illustrates a via conductor.

DESCRIPTION OF PREFERRED EMBODIMENTS

Figure 1:
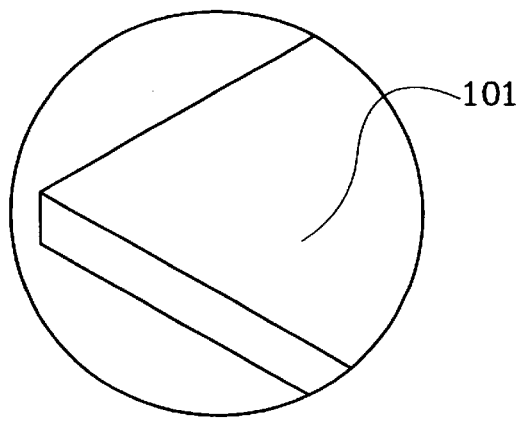
FIG. 1 illustrates some steps in an LTCC process.
Figure 1:
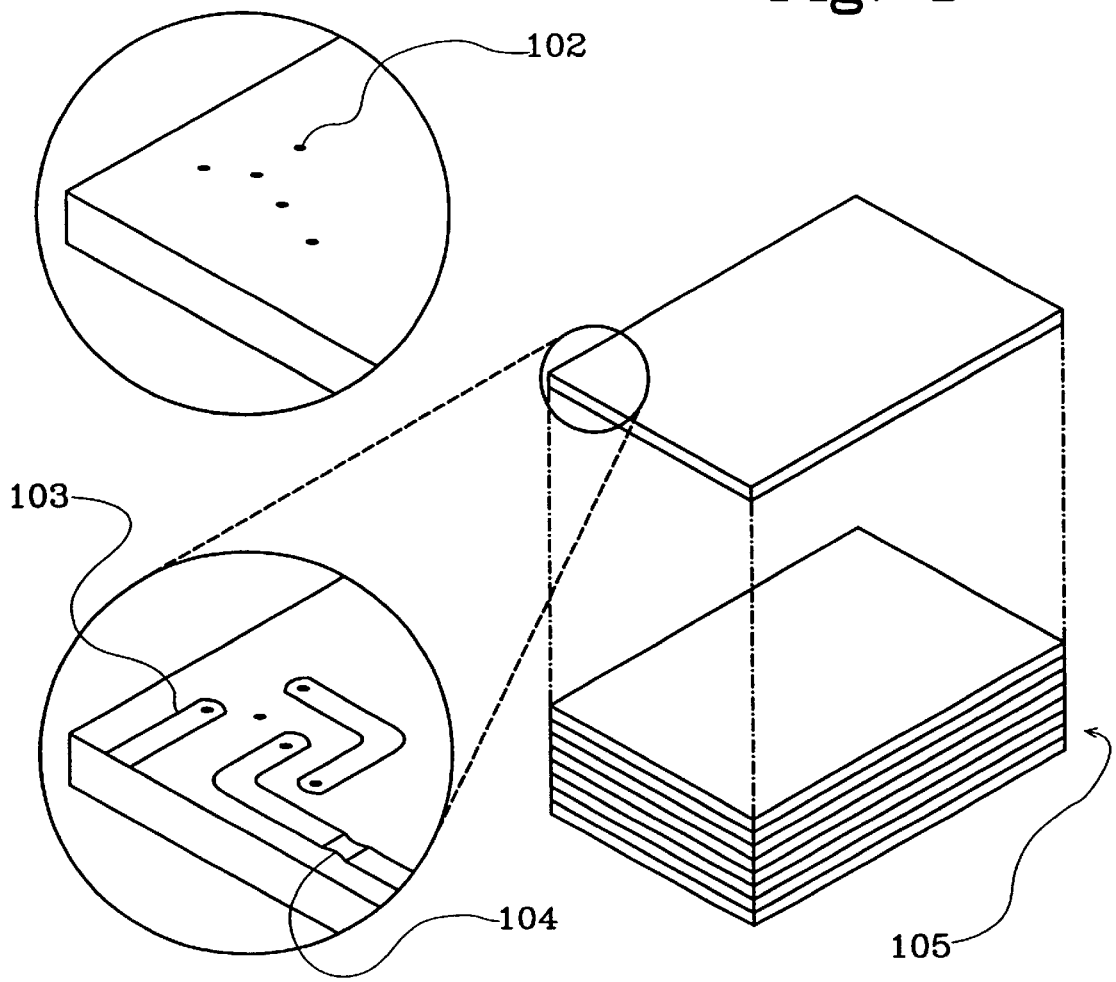

FIG. 1 illustrates some steps in an LTCC process. The substrate sheets 101 used in the process are preferably made of a thin dielectric ceramic material. In a first step, holes 102 are punched in predetermined patterns in these substrates 101. These holes 102 are filled with a suitable conductive material, such as for instance gold. Then conductors 103 are printed on one or in some cases two sides of the substrate by using a screen printing process. Components 104 such as resistors may also be disposed on the substrate 101. In circuits operating at microwave frequencies, components such as capacitances and filters of different kinds may often be formed by different configurations of planar conductors.

When all substrate sheets are prepared they are stacked into a pile 105. The pile 105 may include up to more than 40 layers, but 10 is considered a more normal number. The pile 105 may be laminated and preheated before it is fired in an oven at around 850° C., typically for about 2 hours. After the firing the vias formed by the conductive material in the via holes interconnect different layers in the circuit. Vias may also be formed which extend through more than one layer, i.e. including plural segments.

Figure 2A:
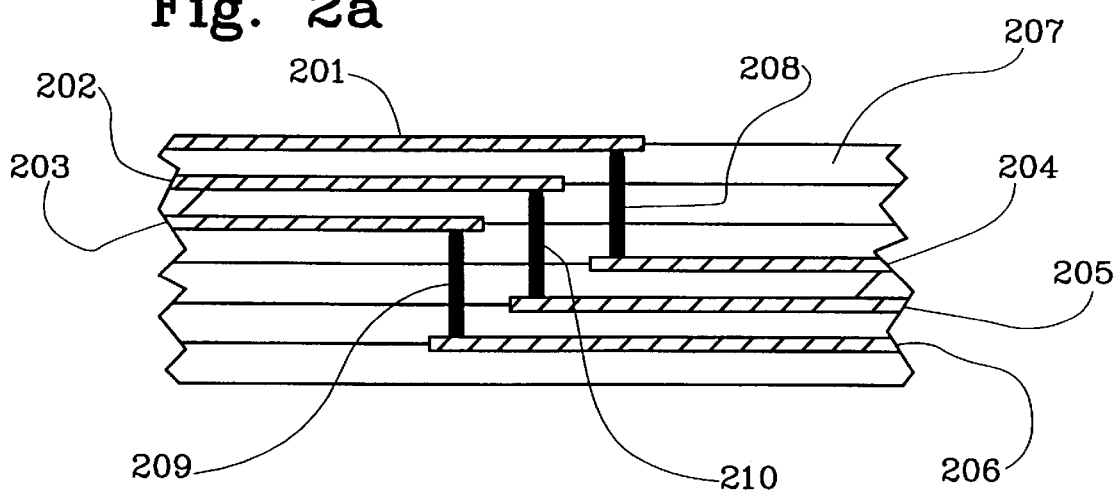
FIG. 2a and 2b show a vertical transition between two transmission lines of the stripline type according to known art.
Figure 2B:
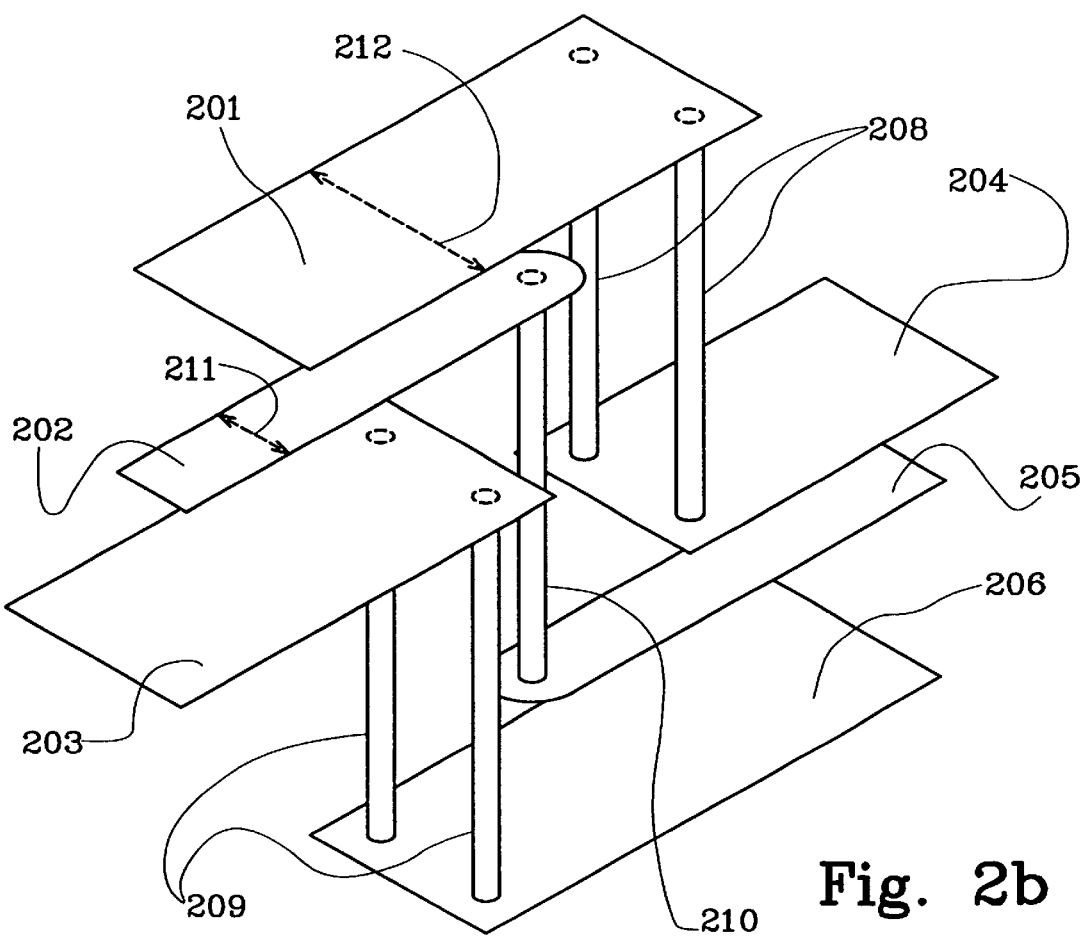

FIG. 2a and 2b show a vertical transition between two transmission lines of the stripline type according to known art. A first view is shown in FIG. 2a. A first transmission line 201, 202, 203 consists of an upper ground conductor 201, a signal conductor 202 and a lower ground conductor 203. These conductors are each printed on a respective substrate layer 207. A second transmission line 204, 205, 206 including an upper ground conductor 204, a signal conductor 205 and a lower ground conductor 206 extends vertically offset from the first transmission line. In the depicted case, the first 201, 202, 203 and second 204, 205, 206 transmission lines are printed on non-intersecting sets of layers. This is however not necessary, the signal conductor 202 of the first transmission line and the upper ground conductor 204 of the second transmission line could for instance be printed on the same substrate layer.

A first number of vias 208 interconnect the upper ground conductors 201, 204 of the first and second transmission lines. A second via 210 interconnects the signal conductors 202, 205 of the first and second transmission lines. A third number of vias 209 interconnect the lower ground conductors 203, 206 of the first and second transmission lines. This is seen more clearly in FIG. 2b. For clarity reasons, the proportion of the vias are slightly changed in FIG. 2b. The thickness of a substrate layer is often less than twice as large as the diameter of a via hole.

The transmission lines shown in FIG. 2b are stripline transmission lines, each having upper 201 and lower 203 planar ground conductors with an interposed planar signal conductor 202. The lateral extension 211 of the signal conductor 202 is normally less than the lateral extensions 212 of the respective ground conductors 201, 203.

A microstrip transmission line (not shown) could be obtained by taking away the upper or the lower ground conductor of one of the transmission lines shown in FIG. 2b. A quasi-coaxial transmission line (not shown) could be obtained by interconnecting the upper and lower ground conductors of a transmission line, by means of vias. The vias are then placed at regular distances at the lateral sides of the ground conductor. The invention described herein works with stripline, microstrip and quasi-coaxial transmission lines.

Figure 3A:
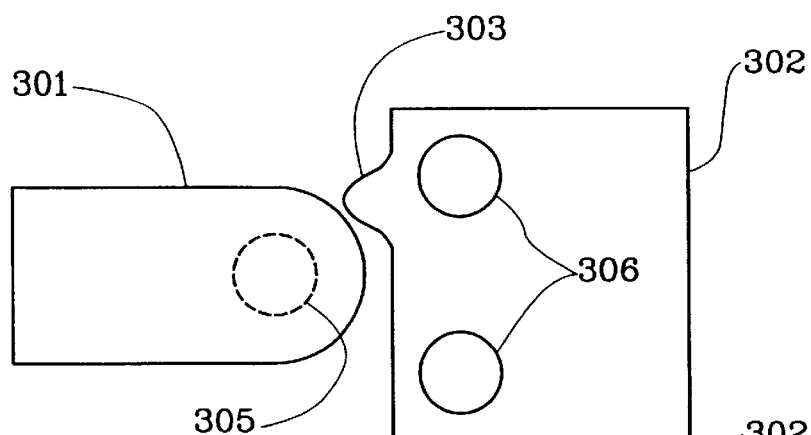
FIG. 3a, 3b, 3c and 3d illustrate schematically compensating arrangements for a transition between two transmission lines in a multilayer structure.

FIG. 3a, 3b, 3c and 3d illustrate compensating arrangements for a transition between two transmission lines in a multilayer structure. The arrangement depicted in FIG. 3a includes a signal conductor 301. A signal via 305 connects the signal conductor 301 to another planar signal conductor (not shown), situated in another layer. A planar ground conductor 302 is printed on a lower layer in the structure compared to the layer of the signal conductor 301. Ground vias 306 connect the ground conductor 302 to another ground conductor (not shown) higher up in the structure. The signal via 305 intersects the plane in which the planar ground conductor 302 extends. A compensating element 303 is formed as a projection in the ground conductor. The compensating element 303 projects towards the area where the signal via 305 intersects the plane in which the planar ground conductor 302 extends. In an ideal case, for instance as depicted in FIG. 3a, the compensating element serves to raise the capacitance between the planar ground conductor and the signal via 305 to a suitable level which improves the transmission properties of the transition.

Figure 3B:
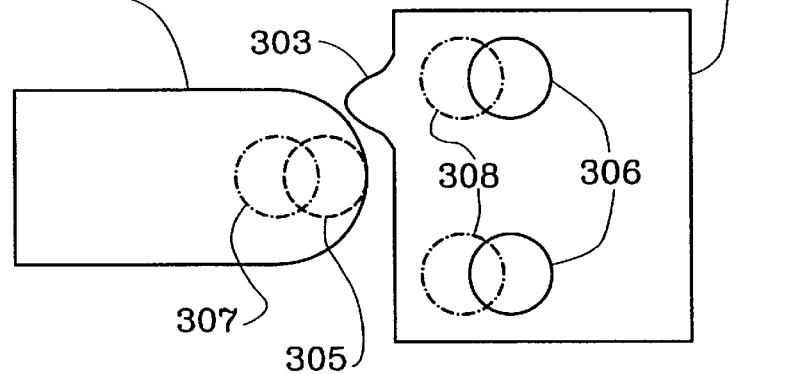

Due to the manufacturing tolerances of an LTCC process, however, the corresponding transitions in a number of circuits of a batch with a given size are likely to look similar to the transition shown in FIG. 3b. In this transition the via hole pattern in the layer immediately above the layer on which the planar ground conductor 302 is printed has been moved to the right. At least this segment part of the signal via 305 has thus left its intended position 307. Other parts of the via, i.e. parts which are built from material disposed in corresponding via holes in other layers, may still be situated near the ideal position. The same applies to the ground vias 306.

At least a part of the signal via 305 is thus situated closer to the planar ground conductor 302 and its compensating element 303 than was intended. This results in a higher capacitance between the signal via and the planar ground conductor than was intended. Since the relation between distance and capacitance is a non-linear one, a small move of the via hole pattern in question may render the capacitance far too large. This may be very detrimental to the transmission properties of the transition. Therefore in most cases the transitions have been under-compensated in order to increase the yield of the LTCC process. This, of course, also reduces the RF performance, e.g. bandwidth, of the circuit.

Figure 3C:
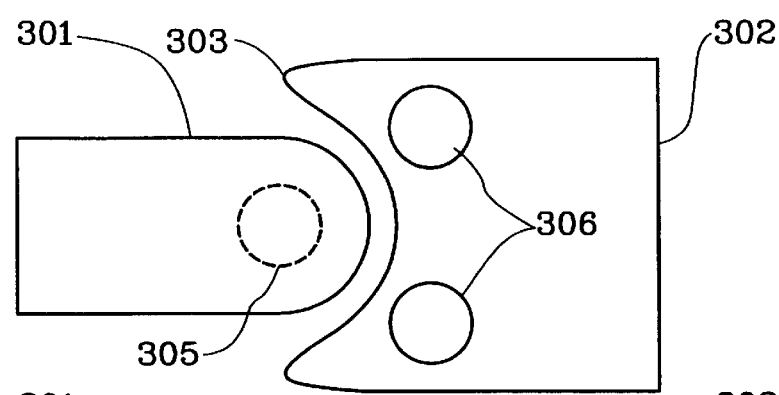
Figure 3D:
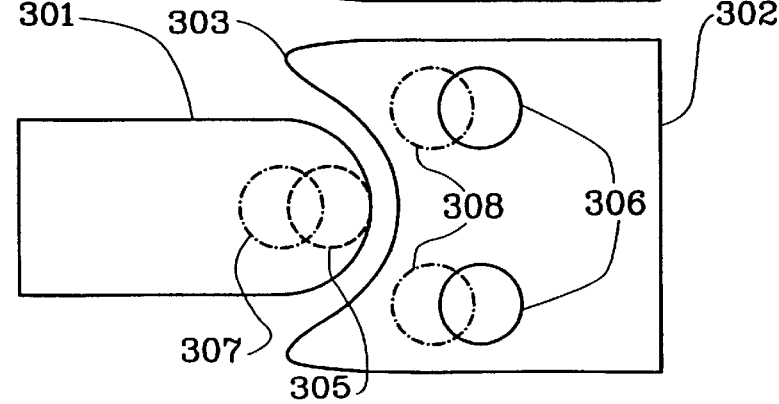

In FIGS. 3c and 3d, the identical problem as shown in FIGS. 3a and 3b is illustrated with a different compensating structure 303.

FIG. 4a and 4b illustrate a compensating arrangement in accordance with the invention for a transition between two transmission lines. The transmission line involves a planar signal conductor 401, to which a signal via conductor 405 is connected. As in FIGS. 3a and 3c, ground via conductors 406 are connected to a planar ground conductor 402. In accordance with the invention, a compensating planar conductor 404 is printed on the same substrate as and close to the planar ground conductor 402. The compensating planar conductor 404 is printed in the vicinity of the area where the signal via 405 intersects the plane in which the planar ground conductor 402 and the compensating planar conductor 404 extend. The planar ground conductor 402 and the compensating planar conductor 404 are non-intersecting, there is a minimum distance between their edges which is larger than zero, but smaller than the diameter of a via hole.

In an ideal case the planar ground conductor 402 and the compensating conductor 404 are interconnected by a compensating via 409 consisting of the conductive material, with which a compensating via hole is filled. This via is formed in the layer in which the planar ground conductor 402 is printed or in an adjacent layer on the side of the planar ground conductor 402. This compensating via 409 makes the compensating arrangement more tolerant of displacement of the segment of the signal via 405 which is situated in the same layer as the compensating via 409. The compensating planar conductor 404 may be formed to surround the signal via 405 in a circular segment manner. In this position the schematic equivalent model of the compensating structure may be written as a single capacitance C.

If during manufacturing of the circuit a displacement of a via hole pattern takes place, similar to the ones which take place between FIGS. 3a and 3b or 3c and 3d, the relevant via hole pattern is displaced as is shown in FIG. 4b. A part of the signal via 405 is then situated closer to the planar ground conductor 402. In an arrangement according to the invention however, the topology of the compensating arrangement has also changed. The compensating via 409 belongs to the same via hole pattern as the displaced segment of the signal via 405. Therefore, the compensating via 409 is also displaced, which disconnects the compensating planar conductor 404 from the planar ground conductor 402. The schematic equivalent model of the compensation can therefore be described as two capacitances connected in series, which compensates for the displacement of the signal via segment towards the planar ground conductor. The capacitance of the compensating arrangement may thus still be within the intended range even though a certain displacement of a signal via segment has taken place.

FIG. 5a is a three-dimensional view of a transmission line transition in accordance with the invention. A first transmission line is shown, including upper 501 and lower 503 planar ground conductors as well as a planar signal conductor 502. The first transmission line extends in a first set of layers in a multilayered RF-circuit. A second transmission line includes upper 504 and lower 506 planar ground conductors as well as a planar signal conductor 505. The second transmission line extends in a second set of layers in a multilayer RF-structure. The respective upper and lower planar ground conductors, as well as the planar signal conductors of the first and second transmission lines are interconnected by means of via conductors 508, 509, 510, which extend in a direction substantially perpendicular to the planes in which the planar conductors extend. The via conductor 510, interconnecting the respective planar signal conductors 502, 505, intersects the plane in which the upper ground conductor 504 of the second transmission lines extends. The via conductor 510 is not in contact with the upper ground conductor 504.

A compensating arrangement 511, 512 is arranged between the upper ground conductor 504 of the second transmission line and the signal via 510. The compensating arrangement consists of a compensating planar conductor 511 and a compensating via 512. If the part 513 of the signal via 510 which belongs to the same via hole pattern as the compensating via 512 is moved during manufacturing, the compensating via is moved as well. This serves to disconnect the compensating planar conductor 511 from the relevant planar ground conductor 504. As is shown in FIG. 5 the compensating planar conductor 511 may be formed, at least partly in a recess in the relevant planar ground conductor 504.

In FIG. 5a, for clarity reasons, a compensating conductor in accordance with the invention has been placed between the upper ground conductor 504 of the lower transmission line and the signal via only. Such arrangements may however also be used, for instance, between the signal via 510 and the lower ground conductor 503 of the first transmission line or between the planar signal conductor 502 of the first transmission line and the signal vias 508, interconnecting the upper planar ground conductors 501, 504 of the first and second transmission lines.

As in FIG. 2b the proportion of the vias are slightly changed in FIG. 5a. A via conductor with more appropriate proportions is shown in FIG. 5b. The via is then built up from four via segments 515, 516, 517, 518. The segments are slightly displaced vis-à-vis one another during manufacturing.

Figure 6:
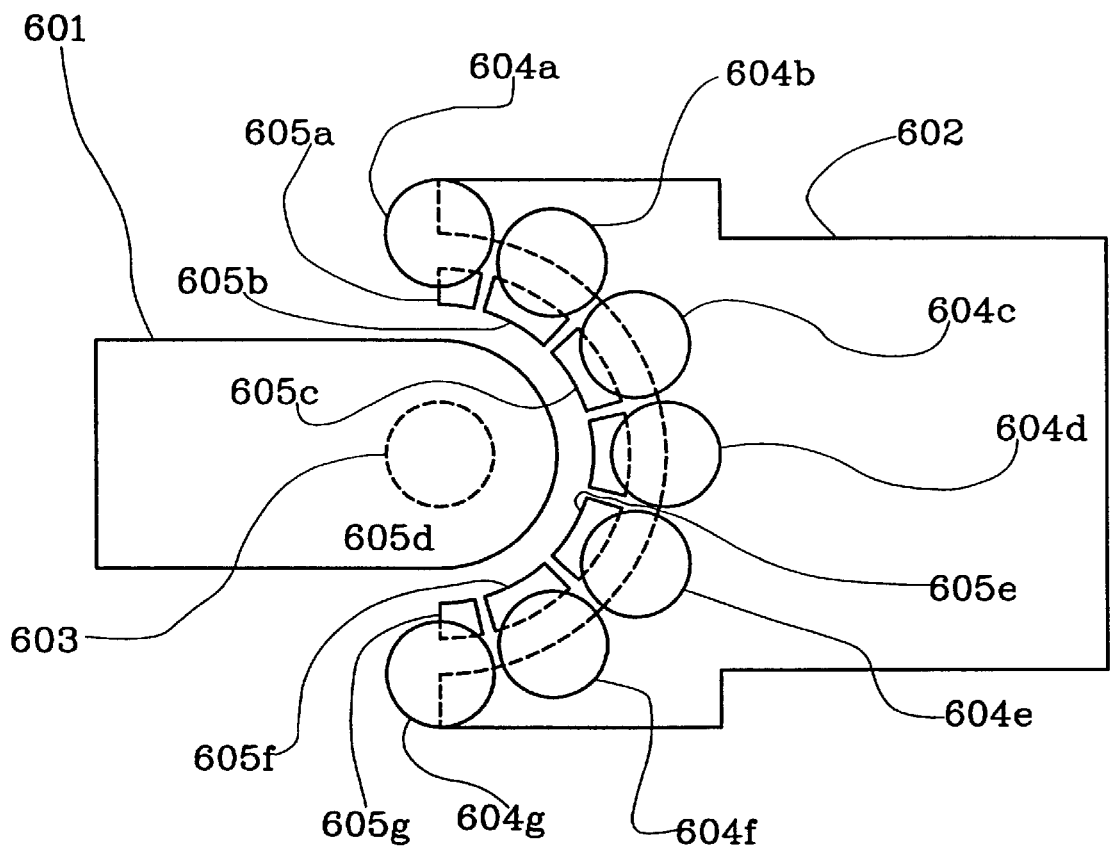
FIG. 6 illustrates another compensating arrangement in accordance with the invention for a transition between two transmission lines.

FIG. 6 illustrates another compensating arrangement in accordance with the invention for a transition between two transmission lines. A planar signal conductor 601 is connected to a corresponding planar signal conductor (not shown), which is situated in another layer, by means of a signal via conductor 603. The signal via conductor 603 intersects the plane in which a planar ground conductor 602 extends, in the vicinity of one of its edges. A variable compensating arrangement 604a–604g, 605a–605g is arranged between the planar ground conductor 602 and the via 603. This is used to compensate for a displacement from the ideal position of a substrate segment of the via conductor 603 vis-à-vis the planar ground conductor 602. The compensating arrangement consists of a number of planar compensating conductors 605a–605g, which are non-intersecting with the planar ground conductor 602, but which extend in the same plane. The compensating conductors 605a–605g are placed between the planar ground conductor 602 and the signal via conductor 603 and form together a half-circular pattern. Each of the compensating conductors 605a–605g are, in an ideal relative position of the relevant segment of the via 603 and the planar ground conductor 602, connected to the ground conductor by means of a corresponding compensating via 604a–604g. The compensating vias 604a–604g consist of conductive material disposed in via holes in the substrate in which the relevant segment of the signal conductor via 603 for which process tolerance is to be achieved extends.

The compensating arrangement as depicted in FIG. 6 is capable of compensating for movements of the via hole pattern in relation to the relevant planar conductor pattern in two dimensions. If the via hole pattern is moved upward during manufacturing, the segment of the signal conductor via 603 approaches the upper planar compensating conductors 605a, 605b. In this case one or both of these conductors may be released by their respective compensating vias 604a, 604b, while other compensating conductors are still connected to the planar ground conductor 602. A movement to the right in the figure of the via hole pattern during manufacturing may cause the centre compensating conductors 605c, 605d, 605e to be released by their respective compensating vias 604c, 604d, 604e. The lower planar compensating conductors 605f, 605g, for instance, on the other hand, may still be connected to the planar ground connector 602 by the compensating via 604g.

It should be noted that the scope of the invention is not limited to the embodiments described above. Various changes may be made without departing from the scope of the appended claims. For instance, process tolerance may be achieved separately for a via segment constituted by a filled via hole in the substrate on which a planar conductor is printed and a via segment constituted by a filled via hole in the substrate adjacent to the substrate on which the planar conductor is printed on the side of this conductor. These via segments may both belong to the same via conductor, but their tolerances could be independent.

It is also possible to make the compensation stepwise variable by providing multiple compensating conductors. Then, if a first movement of a via hole pattern in certain direction takes place during manufacturing only a first compensating conductor is released by its corresponding via, while a second compensating conductor is still connected to a planar ground conductor. If a second movement takes place, which is larger than the first movement, then also the second conductor is released.

The invention is useful also in transitions in multilayered RF circuits, where the transition in itself is not undercompensated. One such an example is where limitations in size render the transition itself over-compensated.

The compensating via of a compensating arrangement in accordance with the invention may in the same time be used to connect a planar conductor on a first layer to a planar conductor on another layer.

The invention is also applicable to other processes than the LTCC process, such as the LTTT process, where LTTT is an abbreviation for Low Temperature Transfer Tape.

What is claimed is:

1. An arrangement in a multilayered electronic circuit for radio frequency applications, said circuit comprising a number of substrate layers, wherein a first planar conductor (504) is formed on a first substrate layer among said plurality of substrate layers; said circuit further comprising a first via hole, formed in said first substrate layer or in a substrate layer adjacent to said first substrate layer on the side of the first planar conductor, said first via hole being filled with a conductive material constituting a first via segment (513), where the capacitive coupling between the first via segment (513) in said first via hole and said first planar conductor (504) is intended to be within a predetermined range characterised in that a compensating planar conductor (511) is situated between said first via hole segment (513) and said first planar conductor (504) on the same side of the same substrate layer as said first planar conductor (504), said first (504) and said compensating (511) planar conductors being non-intersecting; and that said first (504) and said compensating (511) planar conductors are interconnected by a conductive material (512) disposed in a compensating via hole, which is formed in the same substrate layer as said first via hole.

2. An arrangement in a multilayered electronic circuit for radio frequency applications as claimed in claim 1 characterised in that it comprises more than one such compensating planar conductor and more than one such compensating via hole.

3. An arrangement in a multilayered electronic circuit for radio frequency applications as claimed in claim 1 characterised in that said via conductor segment (513) in said first via hole forms part of a signal via (510) in a transition between two planar transmission lines and that said first planar conductor (504) forms part of a ground conductor in one of said two planar transmission lines.

4. An arrangement in a multilayered electronic circuit for radio frequency applications as claimed in claim 1 characterised in that said via conductor segment (513) in said first via hole forms part of a ground via in a transition between two planar transmission lines and that said first planar conductor (504) forms part of a signal conductor in one of said two planar transmission lines.

5. An arrangement in a multilayered electronic circuit for radio frequency applications as claimed in claim 3 characterised in that said compensating planar conductor (511) is formed at least partly in a recess in said first planar conductor (504).

6. An arrangement in a multilayered electronic circuit for radio frequency applications as claimed in claim 3 characterised in that said compensating planar conductor (404) is formed to at least partly surround said via segment (405).

7. A multilayer RF-circuit including a plurality of layers, one of said layers having a circuit pattern disposed at one of its surfaces and a first via (513) and a second via (512), in said layer or in a layer adjacent to said layer and wherein the first via is disposed outside said circuit pattern and second via is disposed beside said circuit pattern characterised in that said circuit pattern includes a first part (504) and a compensating part (511) that is separate from the first part and closest to the first via (513) and wherein the second via interconnects the first and the second parts.

8. A multilayer RF-circuit as claimed in claim 7 wherein said first and second via comprises conductive material in a via hole.

9. A multilayer RF-circuit as claimed in claim 7 wherein the distance between the first and second part are smaller than the diameter of the second via hole (512).

* * * * *